US008432152B2

(12) United States Patent
de Graauw

(10) Patent No.: US 8,432,152 B2
(45) Date of Patent: Apr. 30, 2013

(54) APPARATUS FOR FEEDING ANTENNA ELEMENTS AND METHOD THEREFOR

(75) Inventor: Antonius Johannes Matheus de Graauw, Haelen (NL)

(73) Assignee: NXP B.V., Eindhoven (NL)

( * ) Notice: Subject to any disclaimer, the term of this patent is extended or adjusted under 35 U.S.C. 154(b) by 222 days.

(21) Appl. No.: 13/062,291

(22) PCT Filed: Aug. 17, 2009

(86) PCT No.: PCT/IB2009/053612
§ 371 (c)(1), (2), (4) Date: Mar. 4, 2011

(87) PCT Pub. No.: WO2010/026501
PCT Pub. Date: Mar. 11, 2010

(65) Prior Publication Data

US 2011/0156694 A1 Jun. 30, 2011

(30) Foreign Application Priority Data

Sep. 5, 2008 (EP) .................................... 08163813

(51) Int. Cl.
*G01R 23/08* (2006.01)

(52) U.S. Cl.
USPC ....................................................... 324/76.51

(58) Field of Classification Search ............... 324/76.51, 324/762.01–762.1, 750.01–750.3; 257/48; 438/14–18
See application file for complete search history.

(56) References Cited

U.S. PATENT DOCUMENTS 3,090,928 A 5/1963 Welty
3,308,456 A 3/1967 Levenson et al.
6,313,644 B1 * 11/2001 Kim et al. ..................... 324/645
6,969,999 B2 * 11/2005 Tsuchihashi et al. ......... 324/633
2005/0179609 A1 8/2005 Holly
2007/0053451 A1 3/2007 French et al.
2007/0116105 A1 5/2007 Tero et al.

OTHER PUBLICATIONS

Rotman, W., et al, "Wide-Angle Microwave Lens for Line Source Applications", IEEE Trans. on Antennas and Propagation, pp. 623-632 (Nov. 1963).
Hall, P.S., et al, "Review of Radio Frequency Beamforming Techniques for Scanned and Multiple Beam Antennas", IEEE Proceedings, vol, 137, pt. H, No. 5, pp. 293-303 (Oct. 1990).

(Continued)

*Primary Examiner* — Tung X Nguyen

(57) ABSTRACT

An apparatus (100) for feeding antenna elements of a phased array antenna, comprises: at least two transmission lines (101, 101) disposed in parallel and operated at a certain frequency as resonators, each of the transmission lines (101, 101) having a predetermined length dimensioned to be at least approximately an electrical quarter-wavelength of the operating frequency, a plurality of measuring positions provided on the transmission lines (101, 101) in spacings along the longitudinal direction (x) of the transmission lines, wherein each measuring position on one of the two transmission lines (101) faces directly a corresponding neighbored measuring position on the other transmission line (101) and such corresponding measuring positions being adjacent to each other in a direction transverse to the longitudinal direction of the transmission lines (101, 101) form a measuring position pair, respectively, wherein each of the circuits (110, 120, 130) detects and amplifies/attenuates the measuring signals from an assigned measuring position pair associated with the transmission lines (101, 101) for a corresponding longitudinal position as a function of a resonant field in the transmission lines at the respective positions, and further adds the measured and processed signals in order to generate output signals for feeding corresponding antenna elements.

13 Claims, 7 Drawing Sheets

OTHER PUBLICATIONS

Hashemi, H., et al. "A 24-GHz SiGe Phased-Array Receiver—LO Phase-Shifting Approach", IEEE Trans. Microwave Theory & Techniques, vol. 53, No. 2, pp. 614-626 (Feb. 2005).
Schulwitz, L., et al. "A New Low Loss Rotman Lens Design for Multibeam Phased Arrays", IEEE MMT-S Int'l. Microwave Symposium Digest, pp. 445-448 (May 2006).
Natarajan, A., et al. "A 77-GHz Phased-Array Transceiver with On-Chip Antennas in Silicon: Transmitter and Local LO-Path Phase Shifting", IEEE J. of Solid State Circuits, vol. 41, No. 12, pp. 280719 (Dec. 2006).
International Search Report and Written Opinion for Int'l. Patent Appl. No. PCT/IB2009/053612 (Nov. 25, 2009).

* cited by examiner

APPARATUS FOR FEEDING ANTENNA ELEMENTS AND METHOD THEREFOR

FIELD OF THE INVENTION

The present invention relates in general to an apparatus for feeding antenna elements of an antenna array. In particular, the present invention relates to a system comprising the apparatus and an antenna array. More particular, the present invention relates to a method for operating the apparatus for feeding antenna elements.

Such apparatuses serve to accomplish radiation pattern control of a phased array antenna, where the term phased array antenna means an array of multiple antenna elements with the phase and also the amplitude of each antenna element being a variable, providing control of the radiation pattern, in particular the beam direction.

BACKGROUND OF THE INVENTION

A known apparatus to provide beam steering of a phased array antenna is the so-called Butler matrix which is a matrix transmission network with a considerable number of transmission lines or cables where beam steering is accomplished by switching the signal paths between the input and output terminals of the network. Here, the electrical length of a required number of transmission lines is varied by means of electronic switches, such that the Butler matrix represents a passive structure with variable time delays. Since such a switched transmission line concept requires at least a half wave line length per antenna element, this type of structure requires at least this size in two dimensions, making it less suitable for miniaturization and monolithic integration in modern submicron IC technology. Furthermore, in order to limit RF losses, this type of passive structure requires a high quality RF (radio frequency) switch or varactor technology, which is not readily available in baseline integrated technologies.

SUMMARY OF THE INVENTION

Accordingly, it is one object of the present invention to provide an apparatus for feeding antenna elements with dimensions and structures such that the apparatus can be miniaturized quite well and is suitable for monolithic integration in submicron technology.

The object is achieved by the apparatus for feeding antenna elements of a phased array antenna according to claim 1.

Accordingly, an apparatus for feeding antenna elements of a phased array antenna, comprising: at least two transmission lines or lumped circuits with similar transmission properties disposed in parallel and operated at a certain frequency as resonators, each of the transmission lines having a predetermined length dimensioned to be at least approximately an electrical quarter-wavelength of the operating frequency ω, a plurality of measuring positions provided on the transmission lines in spacings along the longitudinal direction of the transmission lines, a plurality of passive or active circuits adapted to detect measuring signals from measuring positions on the transmission lines as a function of a resonant field in the transmission lines at the respective positions, to process these measuring signals, and to generate output signals for feeding corresponding antenna elements.

Since a pair of transmission lines of the apparatus operate as resonators with a respective physical length of a quarter wavelength of the operating frequency, the plurality of electronic circuits provided in the apparatus detect and process signals from corresponding measuring positions on the resonators, wherein the measured signals are a function of amplitude- and phase angle relations at the respective measuring position due to local energy concentrations stored in the resonators as standing wave. Thus, the output signals generated by the electronic circuits reflect the amplitude- and phase relations on the transmission lines at the respective position and can be used as driving signals for antenna elements or as LO (local oscillator) signals for an up conversion mixer between the electronic circuits and the corresponding antenna elements. Due to the small physical length of the resonators the apparatus has the advantage that it can be miniaturized quite well and is suitable for monolithic integration in submicron integrated circuit technology. In addition, the losses are not critical since the transmission lines are configured to be before the electronic circuits.

In an embodiment the measuring positions are provided in equidistant spacings along the transmission lines. Since the measuring positions are disposed in regular intervals on the transmission lines, the associated electronic circuits detect the standing wave on the resonators in regular and constant intervals.

In an embodiment each measuring position on one of the two transmission lines faces directly a corresponding measuring position on the other transmission line and such corresponding measuring positions being adjacent to each other in a direction transverse to the longitudinal direction of the transmission lines form a measuring position pair, respectively, wherein each of the amplification/attenuating circuits detects and processes the measuring signals from an assigned measuring position pair associated with the transmission lines for a corresponding longitudinal position. Therefore, each circuit measures the local energy concentration of the resonating field at an associated coordinate position for different transmission lines.

In an embodiment each transmission line is coupled to a signal source, respectively, and the signal sources operate at the same frequency ω with a phase difference γ with respect to each other, in order to achieve a resonance condition in the transmission lines. In an embodiment one of the transmission lines with one end is coupled to the corresponding signal source, while the other transmission line with its opposite end is coupled to the other signal source. By this configuration the signal sources supply the required energy to generate a standing wave on the transmission lines.

In an embodiment the amplification circuits comprise amplifiers, the gains thereof being adjustable. By adjusting the gains of the amplifiers belonging to respective amplification circuits, even low-level signals can be detected.

In an embodiment the amplification circuits comprise each a first and second amplifier for detection and amplification of measuring signals of an assigned measuring position pair, wherein the first amplifier of an amplification circuit detects and amplifies measuring signals of a measuring position of the first transmission line from a measuring position pair and the second amplifier detects and amplifies measuring signals of a corresponding measuring position of the second transmission line from the same measuring position pair. Thus, each amplification circuit measures with its first and second amplifiers simultaneously the local energy concentration of the field at the corresponding coordinate position in the longitudinal direction for the different transmission lines.

In an embodiment the amplification circuits each comprise a summing element that adds the said measuring signals detected and processed by the circuits and produces an output signal assigned to a measuring position pair for feeding a corresponding antenna element.

An alternative approach uses two antenna elements per branch to sum both signals in the radiated field. The respective output signal is formed by a superposition of signals belonging to different transmission lines.

In an embodiment the gains/losses of the amplifiers of the amplification circuits are controllable by a Digital-to-Analog Converter. A continuous control of the gains of the amplifiers is thus obtained with analog control signals outputted by the Digital-to Analog Converter, whereby the resulting resolution of the measured signals i.e. amplitude and phase in case of digital control is determined by that of the Digital-to-Analog Converter.

In an embodiment the amplification circuits are configured as cascaded amplifiers, in order to realize operational amplifier and power stage properties.

In an embodiment the amplification circuits are realized as field effect transistor circuits and the amplifiers are realized as common source stages, the inputs thereof are coupled to a corresponding measuring position pair and the outputs thereof are coupled to an input of the summing element configured as common gate stage. The realization of the circuitry by use of field effect transistors allows high frequency and low noise application of the apparatus according to the invention. As an advantage the apparatus is suitable for operation at frequencies close to the maximum frequency of the active devices, since parasitic reactance of the input impedance of the active devices can be absorbed in the transmission line resonators.

In an embodiment at least one pair of transmission lines is provided and signals from respective measuring positions of the transmission line pair are detected and amplified by corresponding amplification circuits, and summed such that output signals of the transmission line pair from a respective measuring position are added as steering signals for corresponding antenna elements in a one-dimensional linear antenna array. In the case of a two-dimensional planar antenna array a second transmission line pair is fed with a signal of different phase angles and the output signals of the both transmission line pairs are summed, resulting to the generation of a pencil beam with independent control of perpendicular phase angles.

To sum up, the inventive apparatus has the following advantages: An advantage is that the apparatus is suitable for operation at frequencies close to the maximum frequency of the active devices. The parasitic reactance of the input impedance of the active devices can be absorbed in the transmission line resonators. In addition, since all multiplication coefficients can be selected positive, the amplifiers do not have to switch between inverting and non-inverting operation, which limits normally the parasitic loading of output nodes. A further advantage is that the apparatus can operate at high power efficiency and/or low noise which makes it possible to combine the phase shifting function with the power amplifier or low noise amplifier function. The use of straightforward gain controlled amplifiers avoids the waste of energy in biasing complex multiplier circuits, which is important for the power amplifier efficiency and allows optimization for low noise, which is important for the low noise amplifier function. A still further advantage is that the apparatus provides high resolution phase and amplitude control so that the signal distortion due to incoherent signal summation is limited. The high-resolution control allows accurate calibration of the various signal paths to compensate for process spread and temperature effects. Continuous control is obtained with analog control signals, the resulting resolution in case of digital control is determined by that of the Digital-to-Analog Converter. Accurate phase and amplitude control is further simplified by using just two transmission lines which avoids the occurrence of scan angle dependant phase and amplitude errors due to undesired electromagnetic coupling between transmission lines.

The object is further achieved by a system comprising the apparatus and a phased antenna array, wherein the system operates as a transmitter. As an alternative operation mode a receiver comprising the apparatus and a phased array antenna is provided, wherein the plurality of circuits is reversely operated such that inputs thereof are coupled to respective antenna elements and respective outputs are coupled to a corresponding down conversion mixer so as to convert input signals from the antenna to a lower frequency. The circuits of the receiver comprise amplifiers designed for low noise, in order to detect signals with weak intensity.

Accordingly the method for operating the apparatus comprises: operating at least two transmission lines disposed in parallel at a certain frequency as resonators, detecting measuring signals from measuring positions which are disposed on said transmission lines along their longitudinal direction, processing said measuring signals with individual gain/attenuation factors, wherein signals from measuring positions which are directly adjacent to each other in a direction perpendicular to the longitudinal direction are added to form output signals as a function of a resonant field in the transmission lines at the respective positions for feeding corresponding antenna elements. An economic method is achievable, since the apparatus and system operated by this method is suitable for miniaturization in submicron integrated circuit technology. According to an embodiment of the inventive method a non-constant amplitude distribution and/or phase relation between the signals is generated to affect a radiation pattern for emission/reception by an attributed array antenna. The so obtained radiation pattern has specific characteristics like nulls in the direction of zero or minimum radiation.

The basic idea of the invention resides in operating at least a pair of transmission lines dimensioned as resonators with a electrical length of at least a quarter-wavelength of an operating frequency and a plurality of measuring positions arranged in pairs along the longitudinal direction of the resonators, wherein a plurality of electronic circuits for measuring signals from the corresponding positions on the resonators is provided so as to detect and process with individually adjustable gain/attenuation factors the signals from assigned measuring position pairs associated with the transmission lines for corresponding longitudinal coordinate positions as a function of a resonant field in the transmission lines, and further adds the measured and processed signals in order to generate output signals for feeding corresponding antenna elements.

Preferred embodiments and further developments of the invention are defined in the dependent claims of the independent claims. It shall be understood that the apparatus and the method of the invention have similar and/or identical preferred embodiments and advantages.

BRIEF DESCRIPTION OF THE DRAWINGS

These and other aspects of the invention will be apparent from and elucidated with reference to the embodiment(s) described hereinafter. In the following drawings, the Figures are schematically drawn and not true to scale, and identical reference numerals in different Figures, if any, may refer to corresponding elements. It will be clear for those skilled in the art that alternative but equivalent embodiments of the invention are possible without deviating from the true inventive concept, and that the scope of the invention is limited by the claims only.

DETAILED DESCRIPTION OF EMBODIMENTS

Figure 1:
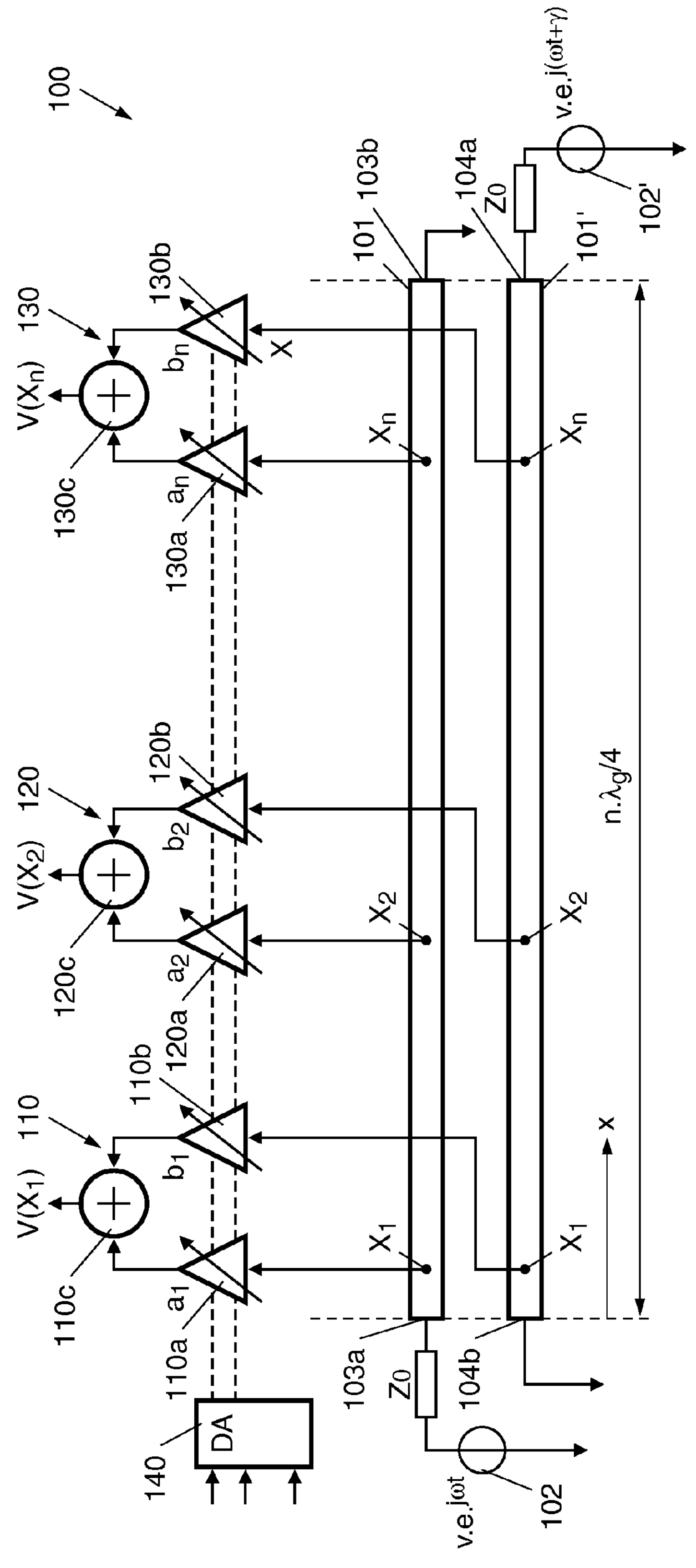
FIG. 1 illustrates schematically a first embodiment of the circuitry of the apparatus according to the invention with two parallel resonant transmission lines and a plurality of amplification circuits coupled with their respective inputs via measuring positions to the transmission lines, the respective gains of the amplification circuits being variable by a Digital-to-Analog Converter and the outputs being used for feeding antenna elements of a phased array antenna.

FIG. 1 illustrates schematically the apparatus 100 according to the invention comprising a first transmission line 101 and a second transmission line 101' which are disposed in parallel along their longitudinal direction x and spaced in a direction transverse to the longitudinal direction; two high-frequency (HF) signal sources 102, 102' coupled to the transmission lines and operated at a certain frequency ω; further a plurality of amplification circuits 110, 120, 130 the inputs thereof coupled to the two transmission lines 101, 101' in regular intervals along their longitudinal direction x and outputs thereof are used for feeding antenna elements. For controlling the amplification circuits 110, 120, 130 a Digital-to-Analog Converter DAC 140 is provided, with its analog control signals the respective amplification circuits 110, 120, 130 are controllable. The respective outputs of the amplification circuits 110, 120, 130 are used for feeding antenna elements (not shown) of a phased array antenna.

To operate the two transmission lines 101, 101' resonant i.e. as resonators, each of the two transmission lines 101, 101' is coupled to an assigned signal source 102, 102', such that a line end 103*a* of the first transmission line 101 is connected to the first signal source 102, wherein the line end 103*a* determines the origin of the coordinate axis x defining the longitudinal direction of the transmission lines 101, 101', and the other opposite line end 103*b* of the first transmission line 101 is grounded, such that the first signal source 102 on the one hand is connected to the first transmission line 101 and on the other hand connected to ground. In contrast to this, the line end 104*a* of the second transmission line 101' being opposite to the line end 103*b* of the first transmission line 101 is connected to the second signal source 102', whilst the other opposite line end 104*b* of the second transmission line 101' is grounded, such that the second signal source 102' on the one hand is connected to the second transmission line 101' and on the other hand connected to ground. Hence, the connecting terminals 103*a* and 104*a* of the two transmission lines 101, 101' are disposed opposite to each other for the assigned signal sources 102, 102', such that by external configuration of the two transmission lines 101, 101' with the respective assigned signal sources 102, 102' an anti-parallel orientation of the transmission lines is obtained. The impedance of the signal sources is designated by Z0. The two signal sources 102, 102' supply low level signals with the same frequency ω, respectively, having however a phase difference γ. Furthermore, the lengths of the two transmission lines 101, 101' along the longitudinal direction x are selected such that a resonance at the operating frequency ω is produced. Since the electrical length of the two transmission lines 101, 101' equals an integer multiple of the quarter lambda wavelength, respectively, i.e. the length $l=n\lambda/4$, where n is a positive natural number and λ is the wavelength of the operating frequency ω, the transmission lines are operated as resonators. Then, the low level signals of the two signal sources 102, 102' coupled to the transmission lines generate a standing wave pattern on the transmission lines 101, 101', wherein the standing wave pattern having associated with it local concentrations of energy.

A number n of identical configured amplification circuits 110, 120, 130, of which FIG. 1 depicts only by way of example three amplification circuits, are provided to detect and amplify measuring signals at 2n measuring positions $x_i$(101) and $x_i$(101') with i=1 to n on the transmission lines 101, 101', wherein n measuring positions $x_i$(101) on the first transmission line 101 are equidistant arranged to each other along the longitudinal direction x of the two transmission lines and also n measuring positions $x_i$(101') on the second transmission line 101' are equidistant arranged to each other along the longitudinal direction x; it is noted and should be appreciated that equidistance is not required but convenient. Since each measuring position on the first transmission line 101 faces directly a corresponding measuring position on the second transmission line 101' as a nearest neighbor in the direction transverse to the longitudinal direction of the lines, directly adjacent measuring positions in the transverse direction form a measuring position pair. Therefore, n measuring position pairs $x_i$(101), $x_i$(101') are obtained, such that each singular measuring position pair $x_i$(101), $x_i$(101') of the two transmission lines 101, 101' has the same coordinate along the longitudinal direction x; hence, two measuring positions belonging to a respective measuring position pair differ from each other only with regard to the direction being orthogonal to the x coordinate axis, in which direction the two transmission lines are spaced from each other. Each amplification circuit is associated with a corresponding measuring position pair, such that (in FIG. 1) a first amplification circuit 110 is provided for detection and amplification of a first measuring position pair $x_1$(101), $x_1$(101'), a second amplification circuit 120 is provided for detection and amplification of a second measuring position pair $x_2$(101), $x_2$(101'), and a n-th amplification circuit 130 is provided for detection and amplification of a n-th measuring position pair ($x_n$, $x_n'$) disposed along the longitudinal direction x of the two transmission lines.

Each amplification circuit 110, 120, 130 comprises two amplifiers 110*a*, 110*b* and 120*a*, 120*b*, as well as 130*a*, 130*b* for detection and amplification of the respectively associated measuring position pair $x_i$(101), $x_i$(101'), such that the first amplifier of a respective amplification circuit 110, 120, 130 is coupled with its input to the respectively assigned measurement position $x_i$ (i=1−n) on the first transmission line 101 and the second assigned amplifier is coupled with its input to the measuring position $x_i$(101') of the second transmission line 101'. Hence, a pair of amplifiers of a respective amplification circuit detects and amplifies measurement signals of the corresponding measuring position pair $x_i$(101), $x_i$(101'). By coupling together the outputs of the two amplifier of each pair of amplifiers to an summing element 110*c*, 120*c*, 130*c*, the respective summing element picks up the signals of a measuring position pair $x_i$(101), $x_i$(101') detected and amplified by the pair of amplifiers and forms a sum of the amplified measurement signals; thus, each output signal formed by the corresponding summing element is a function of the respective measuring point, the amplitude and phase difference of the measured signals at the corresponding measuring points from a measuring point pair. Since the summing element of each amplification circuit is coupled with its output terminal to an corresponding antenna element of a phased array antenna, the summing of the detected and amplified measurement signals formed by the respective summing element of an amplification circuit is used as output signal for steering the corresponding antenna element. Since the amplifiers of the amplification circuits are connected to the analog output lines of the Digital-to-Analog Converter, their gain factors are individually adjustable.

The method according to the invention is based on the following theoretical outline:

Since the transmission lines 101, 101' at opposite ends are supplied with two low level signals from two signal sources 102, 102', where the signal sources have the same frequency ω and a phase difference γ, the two low level signals generate a standing wave pattern on the transmission lines according to equations (1a) and (1b):

$$v_1(x_i,t)=v\cdot\cos(\beta x_i)\cdot e^{j\omega t} \quad (1a)$$

$$v_2(x_i,t)=v\cdot\sin(\beta x_i)\cdot e^{j(\omega t+\gamma)} \quad (1b)$$

where j equals $\sqrt{-1}$, γ is the phase difference, ω the operating frequency, β is the wave number (2π/λ) with the dimension of a reciprocal length, t the time, $v_1$, $v_2$ are two signals, and $x_i$ are measuring positions along the longitudinal direction x of the transmission lines.

Since the amplification circuits 110, 120, 130 are coupled to different measuring positions $x_i$[101], $x_i$[101'] with i=1 to n along the transmission lines 101, 101', the signals from the first and second transmission line 101, 101' are added with a gain factor $a_i$ of the respective first amplifier and $b_i$ of the respective second amplifier of an amplification circuit. The amplitude and phase of the resulting output signal of an amplification circuit is thus a function of the measuring position $x_i$[101], $x_i$[101'] along the transmission line and the value of the respective gain factors $a_i$, $b_i$. This output signal $v(x_i, a_i, b_i)$ is used as driving RF signal for the antenna elements or as LO (local oscillator) signal for an up or down conversion mixer. It goes without saying that an up conversion mixer is used in case that the apparatus is implemented and operated as transmitter.

The relation between the amplitude and the phase of the output signal $v(x_i, a_i, b_i)$ and the position or measuring position along the transmission line and the gain factors $a_i$, $b_i$ is given by the following equations (2a, 2b, 2c):

$$v(x_i, a_i, b_i, t) = v(a_i\cos(\beta x_i) + b_i e^{j\gamma}\sin(\beta x_i))e^{j\omega t} \quad (2a)$$

$$\text{amplitude: } A = v\sqrt{(a_i\cos(\beta x_i) + b_i\sin(\beta x_i)\cos(\gamma))^2 + (b_i\sin(\beta x_i)\sin(\gamma))^2} \quad (2b)$$

$$\text{phase: } \varphi = \arctan\left(\frac{b_i\sin(\beta x_i)\sin\gamma}{(a_i\cos(\beta x_i) + b_i\sin(\beta x_i)\cos\gamma)}\right) \quad (2c)$$

These equations show that the output signals at the left extreme line end (x=0) equals that of the signal source connected to left end of the transmission line:

amplitude: $A=v\cdot a_0$ phase: $\phi=0°$

In a similar way, the output signal at the right extreme line end (x=nλ/4) equals that of the signal source connected to the right end of the transmission line:

amplitude: $A=v\cdot b_n$ phase: $\phi=\gamma°$

The amplitude and the phase of the output signal in between these two extremes can be controlled with the gain factors $a_i$, $b_i$. A convenient choice of coefficients for a large class of phased array antennas is given by equations (3a) and (3b):

$$v(\{a_i\cos(\beta x_i) + b_i\cos(\gamma)\sin(\beta x_i)\}^2 + \{b_i\sin(\gamma)\sin(\beta x_i)\}^2)^{1/2} = va_1 = vb_n \quad (3a)$$

$$\frac{b_i\sin(\gamma)\sin(\beta x_i)}{(a_i\cos(\beta x_i) + b_i\cos(\gamma)\sin(\beta x_i))} = \tan\left(\frac{4x_i\gamma}{n\lambda}\right) \quad (3b)$$

This choice results in a constant amplitude and a linear variation of phase along the longitudinal length of the transmission line:

amplitude: $A=v\cdot a_1=v\cdot b_n$ phase: $\phi=4x_i\gamma/(n\lambda)$

Figure 2:
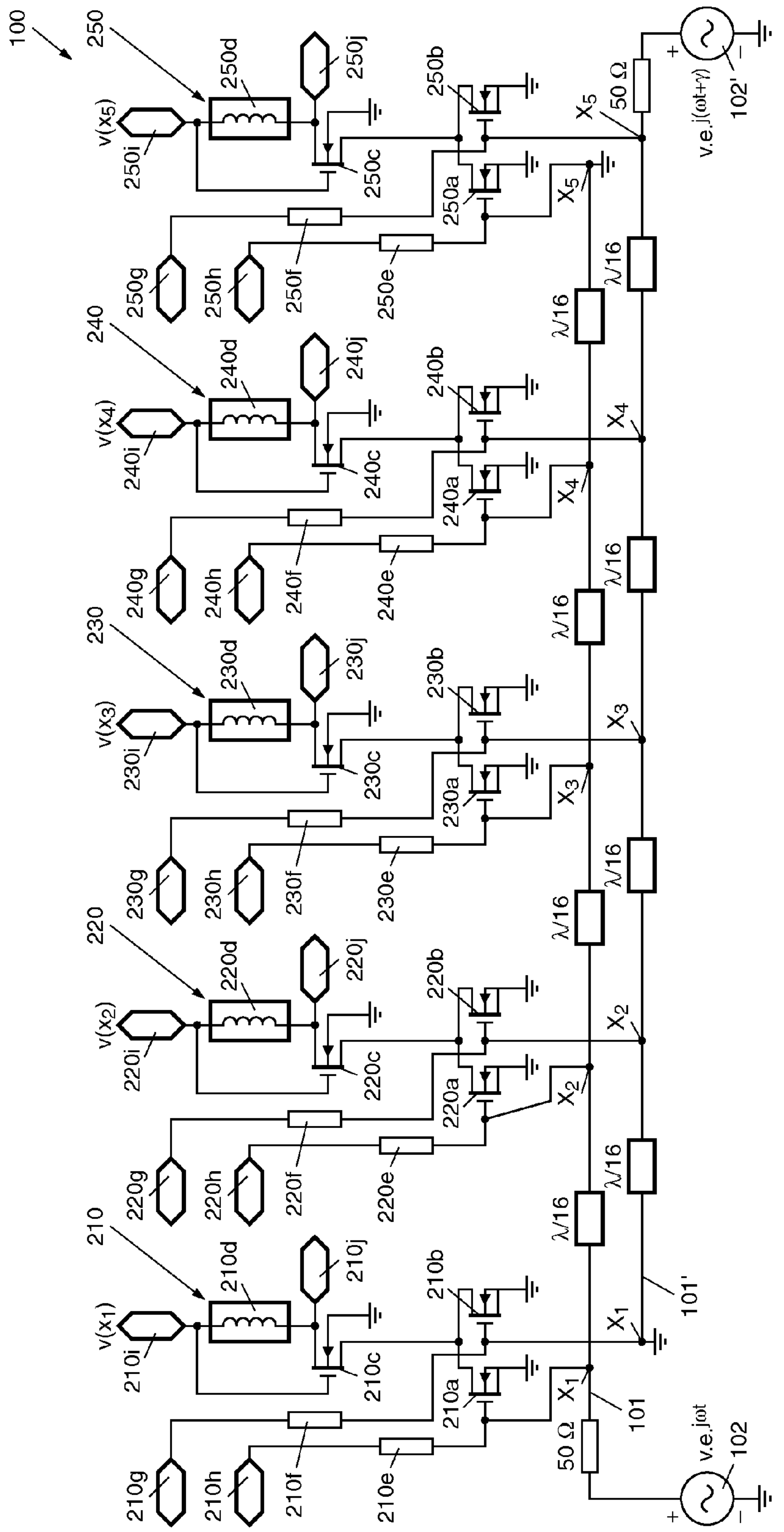
FIG. 2 depicts a second embodiment of the apparatus according to the invention, wherein the two parallel resonant transmission lines with their measuring positions are coupled to inputs of amplifiers of amplification circuits, each configured as cascoded circuits of field effect transistors (FET's), and corresponding outputs of these cascoded circuits are used for feeding antenna elements of a phased array antenna.

FIG. 2 illustrates a second embodiment of the apparatus 100 according the invention. The circuitry of the transmission lines 101, 101' with the signal sources 102, 102' is configured as in FIG. 1, where the impedance of the two sources amounts to 50Ω, as indicated by the depicted resistor symbols.

In this embodiment for the purpose of simplicity the Figure shows only five amplification circuits 210, 220, 230, 240, 250, in order to detect the measuring signals supplied by corresponding five measuring position pairs on the transmission lines. Since the length of line of the two transmission lines 101, 101' is dimensioned to be L=λ/4, consequently the spacing between adjacent measuring position pairs in longitudinal direction equals to λ/16, respectively. Each amplification circuit 210, 220, 230, 240, 250 is configured as a cascoded circuit of n-channel field effect transistors (FET) and serves for detection and amplification of measuring signals from a respectively assigned measuring position pair. For that purpose a first and a second FET 210*a*, 210*b* are configured as common source power stages, wherein the gate terminal of the first FET is coupled to the measuring position $x_i$ and the gate terminal of the second FET is coupled to the measuring position $x_i$(101') for i=1. n of a measuring position pair $x_i$(101), $x_i$(101') and the source terminals together with the bulk terminals of the two FET's 210*a*, 210*b* are grounded. The outputs i.e. drain terminals of the two FET's are coupled to the source terminal of a third FET 210*c* configured in a common gate stage, such that the outputs of the two FET's 210*a*, 210*b* operated as amplifiers are summed in the third FET 210*c*, wherein thus each amplification circuit forms a cascoded amplifier. Between the drain terminal of the third FET 210*c*, 220*c*, 230*c*, 240*c*, 250*c* and the DC power supply 210*i*, 220*i*, 230*i*, 240*i*, 250*i* of each amplification circuit 210, 220, 230, 240, 250 there is a reactive element such as a coil 210*d*, 220*d*, 230*d*, 240*d*, 250*d* interconnected, while the gate terminal of the third FET 210*c*, 220*c*, 230*c*, 240*c*, 250*c* is coupled to the DC power supply 210*i*, 220*i*, 230*i*, 240*i*, 250*i* of the amplification circuit and its bulk electrode is grounded. The outputs $v(x_1)$, $v(x_2)$, $v(x_3)$, $v(x_4)$, $v(x_5)$ of the amplification circuits 210, 220, 230, 240, 250 are connected to the drains 210*j*, 220*j*, 230*j*, 240*j*, 250*j* of the third FET's. For adjustment of the gain factors of the first and second FET's the gate terminals thereof are coupled additionally via respective shunt resistors 210*e*, 210*f*-250*e*, 250*f* and external connection terminals 210*g*, 210*h*-250*g*, 250*h* to analog signal lines of the Digital-to-Analog Converter (DAC) (not shown in this Figure) provided for controlling, while the drain terminal of the third FET is coupled additionally to the DC power supply terminal 210*i*-250*i*. The transconductance $g_m$ of the first and second FET's configured as power stages is controlled by the gate bias. The output signal $\nu(x_i)$ of each cascoded circuit 210, 220, 230, 240, 250 is used to directly feed the corresponding antenna element, or as input of an up conversion mixer. Altogether the apparatus 100' according to this embodiment provides five output signals for feeding a one-dimensional array antenna with signals of constant amplitude and a linear increasing or decreasing phase defined by the value of $\gamma$. However, the embodiment of the inventive apparatus can easily be modified to a greater number of amplification circuits and measuring points than five so as to comply with the total number of a given number of antenna elements.

This embodiment of the apparatus according to the invention is designed for an operating frequency of 60 GHz.

It is to be noted that the amplification of the detected signals is no hard requirement; the apparatus also works by use of passive attenuators to adjust the amplitude of the signals before summing. It is further to be noted that the summation circuit is no hard requirement, the signal can also be summed in the air by using two closely spaced antenna elements per branch.

FIGS. 3-7 show diagrams of the amplitude and phase of the cascoded amplifiers of the apparatus 100 according to this embodiment, wherein on the abscissa the varied frequency around the center frequency of 60 GHz in the scanned range of 55 GHz to 65 GHz and on the ordinate the amplitude measured in dB and the phase in degree, respectively, are plotted; the respective curves show five output signals $\nu(x_1)$, $\nu(x_2)$, $\nu(x_3)$, $\nu(x_4)$, $\nu(x_5)$ of the five cascoded circuits 210, 220, 230, 240, 250 of the apparatus 100.

Figure 3A:
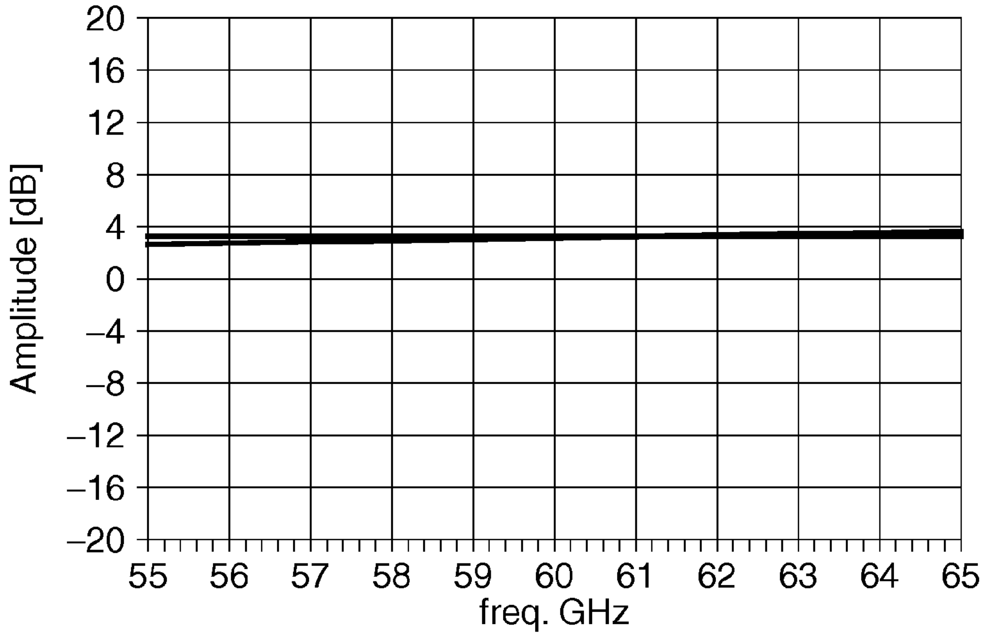
FIGS. 3 to 7 show diagrams of the amplitudes and phase angles of the output signals supplied by the cascoded circuits versus frequency of the apparatus according to the invention of FIG. 2 at different phase differences γ between the sources 102 and 102'.
Figure 3B:
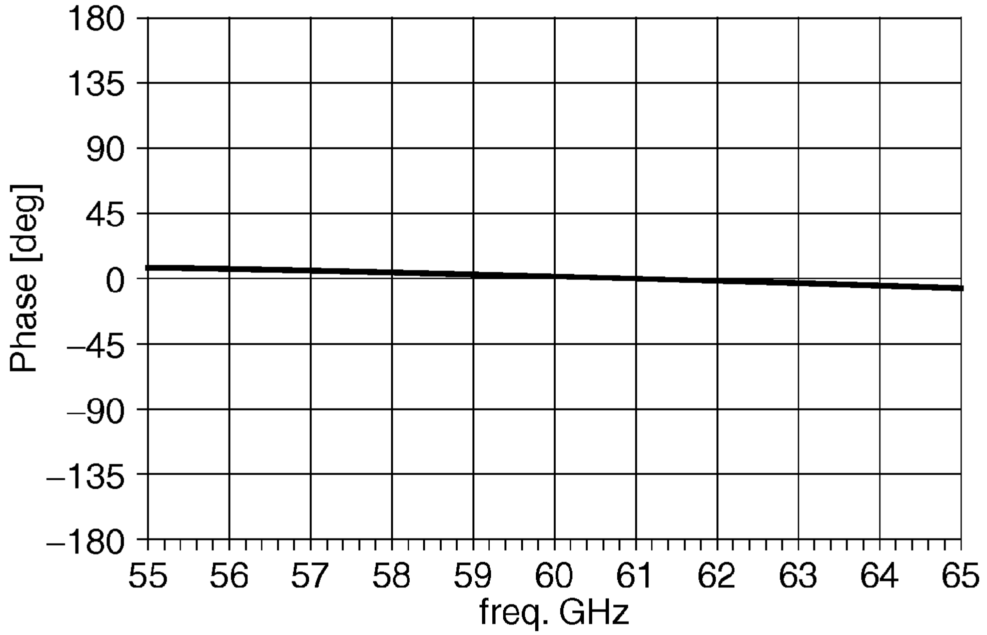

In particular, FIGS. 3(*a*), 4(*a*), 5(*a*), 6(*a*) and 7(*a*) show the amplitudes of the output signals $\nu(x_1)$, $\nu(x_2)$, $\nu(x_3)$, $\nu(x_4)$, $\nu(x_5)$ produced by the cascaded stages, and FIGS. 3(*b*), 4(*b*), 5(*b*), 6(*b*) and 7(*b*) show their phase angles at a given phase difference $\gamma$ between the two signal sources 102, 120'. FIG. 3(*a*) reveals that at a phase difference to be $\gamma=0°$ the amplitude of all measured output signals amounts to approximately a constant value of 3 dB, while FIG. 3(*b*) reveals that the measured phase angle for all output signals amounts to be 0°.

Figure 4A:
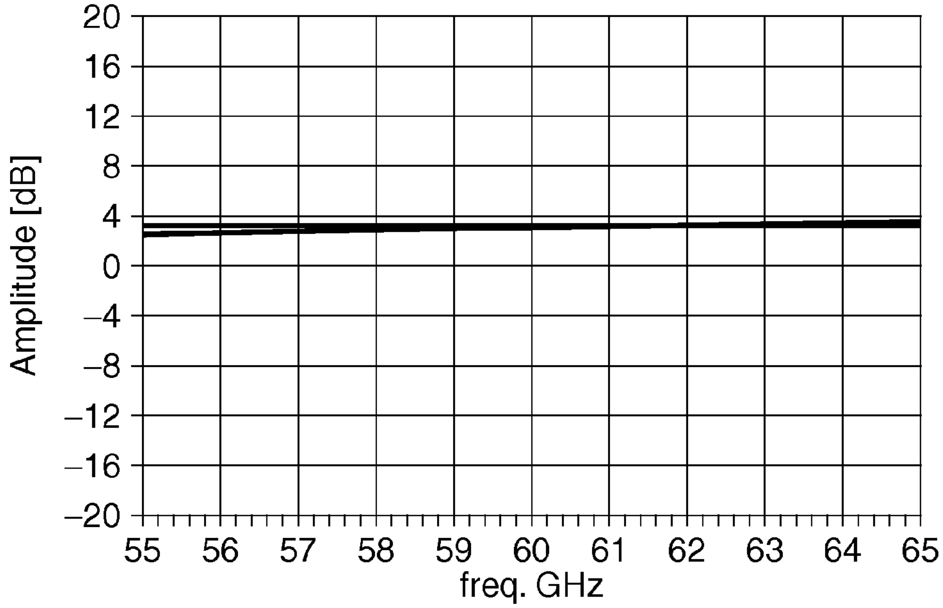
Figure 4B:
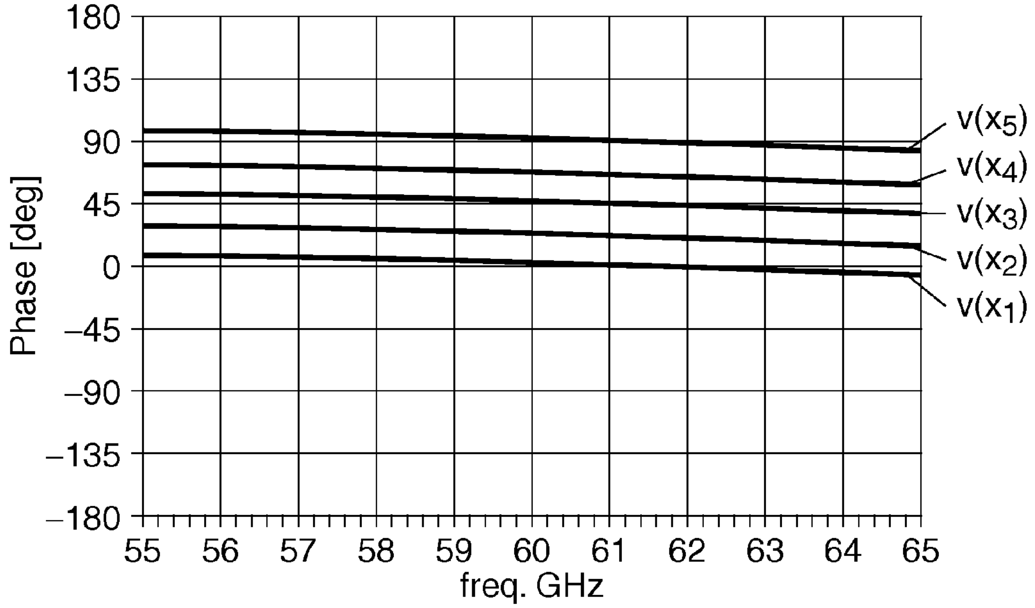
Figure 5A:
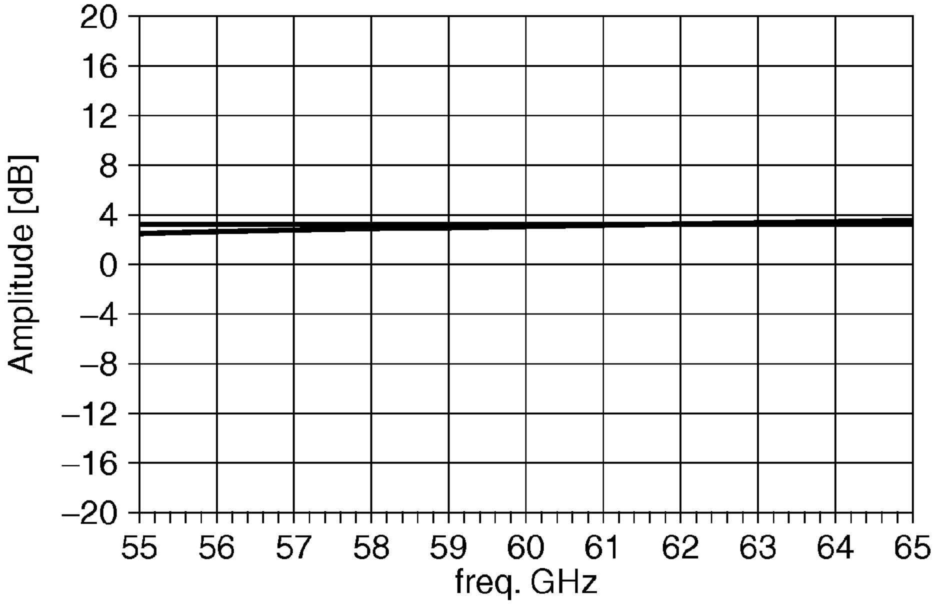
Figure 5B:
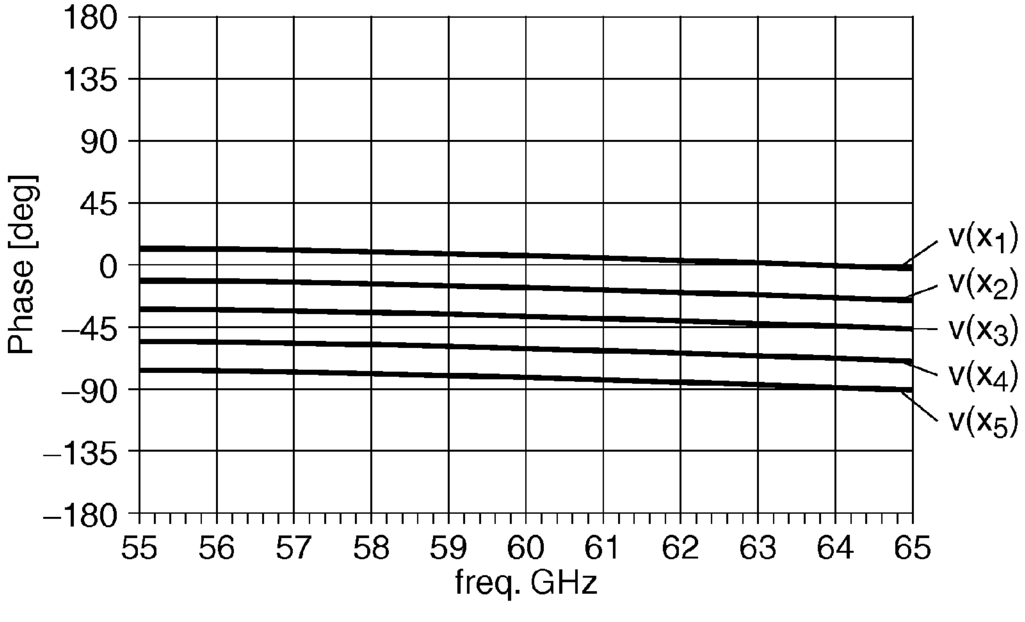

Similarly, in FIG. 4(*a*) the measuring diagram reveals that the amplitudes of the output signals $\nu(x_1)$, $\nu(x_2)$, $\nu(x_3)$, $\nu(x_4)$, $\nu(x_5)$ produced by the cascaded stages have a nearly constant value of approximately 3 dB at a phase difference $\gamma=+90°$, while in FIG. 4(*b*) the phase angles of the output signals are approximately equally spaced starting with $\phi(\nu(x_1))$ at 0° up to $\phi(\nu(x_5))$ at 90°, such that the phase angle spacing $\Delta\phi$ between output signals produced by subsequent cascaded stages is approximately constant and in the magnitude of $\Delta\phi\approx22.5°$. For a phase difference $\gamma=-90°$ between the HF signal sources, the measuring diagram of FIG. 5(*a*) reveals, that the amplitudes of the output signals $\nu(x_1)$, $\nu(x_2)$, $\nu(x_3)$, $\nu(x_4)$, $\nu(x_5)$ produced by the cascaded stages have an approximately constant value of approximately 3 dB, while in FIG. 5(*b*) the respective phase angles are approximately equally spaced starting with $\phi(\nu(x_1))\approx0°$ up to $\phi(\nu(x_5))\approx-90°$, such that the phase angle spacing $\Delta\phi$ between output signals produced by subsequent cascaded stages is approximately constant and in the magnitude of $\Delta\phi\approx-22.5°$.

Figure 6A:
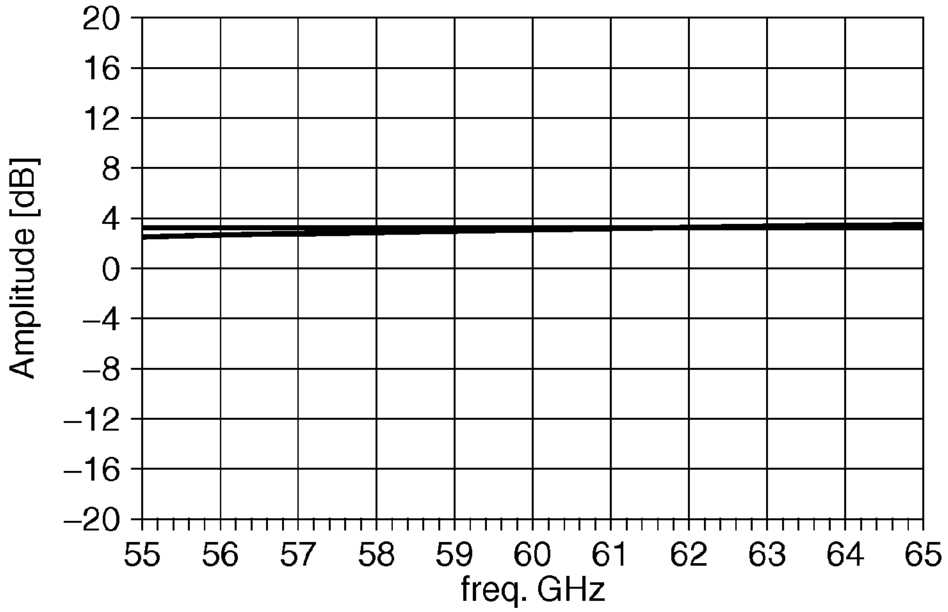
Figure 6B:
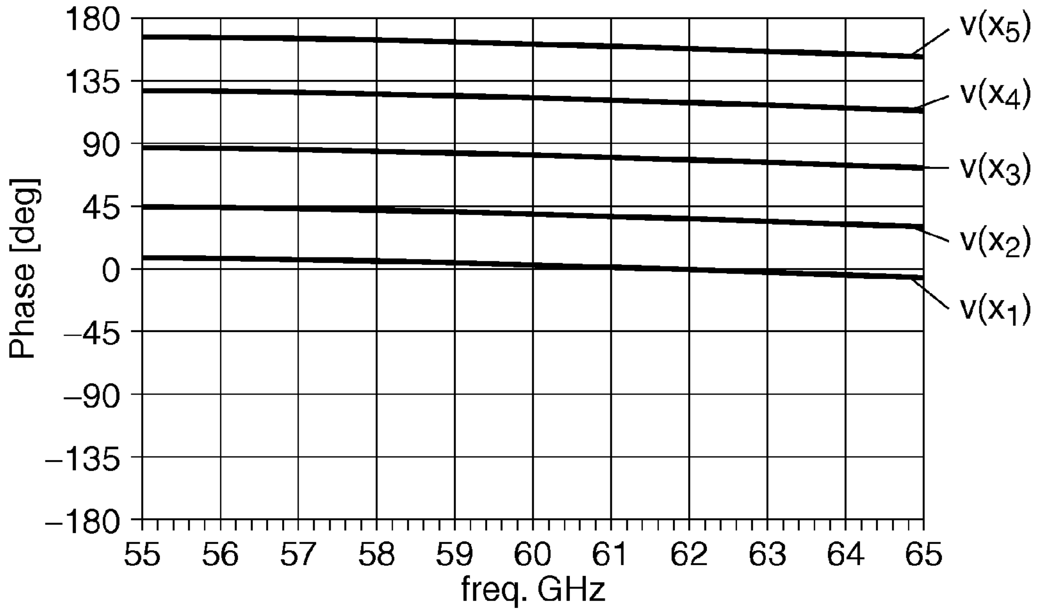

For a phase difference $\gamma=160°$ between the HF signal sources, the measuring diagram of FIG. 6(*a*) reveals, that the amplitudes of the output signals $\nu(x_1)$, $\nu(x_2)$, $\nu(x_3)$, $\nu(x_4)$, $\nu(x_5)$ produced by the cascaded stages have an approximately constant value of approximately 3 dB, while in FIG. 6(*b*) the respective phase angles are approximately equally spaced starting with $\phi(\nu(x_1))\approx0°$ up to $\phi(\nu(x_5))\approx160°$, such that the phase angle spacing $\Delta\phi$ between output signals produced by subsequent cascaded stages is approximately constant and in the magnitude of $\Delta\phi\approx+40°$.

Figure 7A:
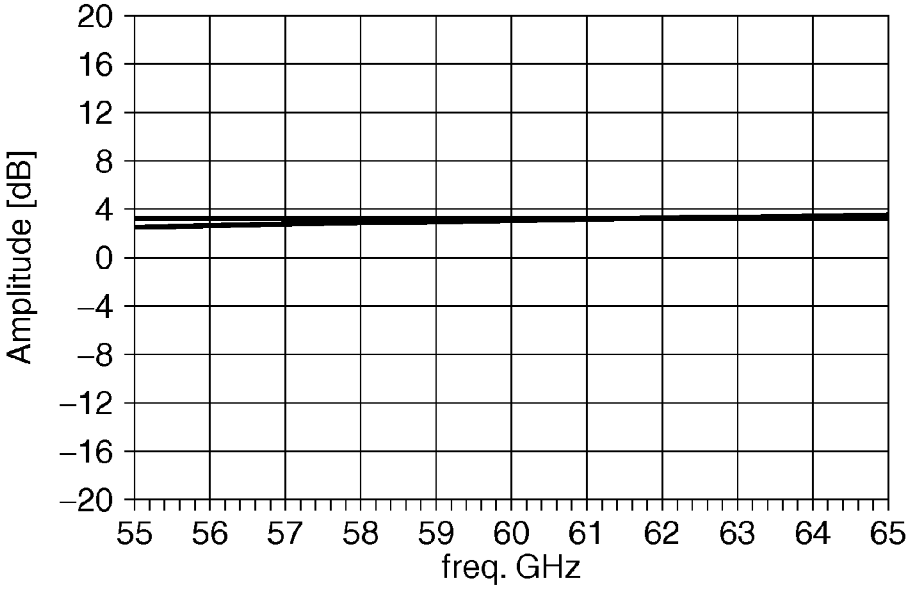
Figure 7B:
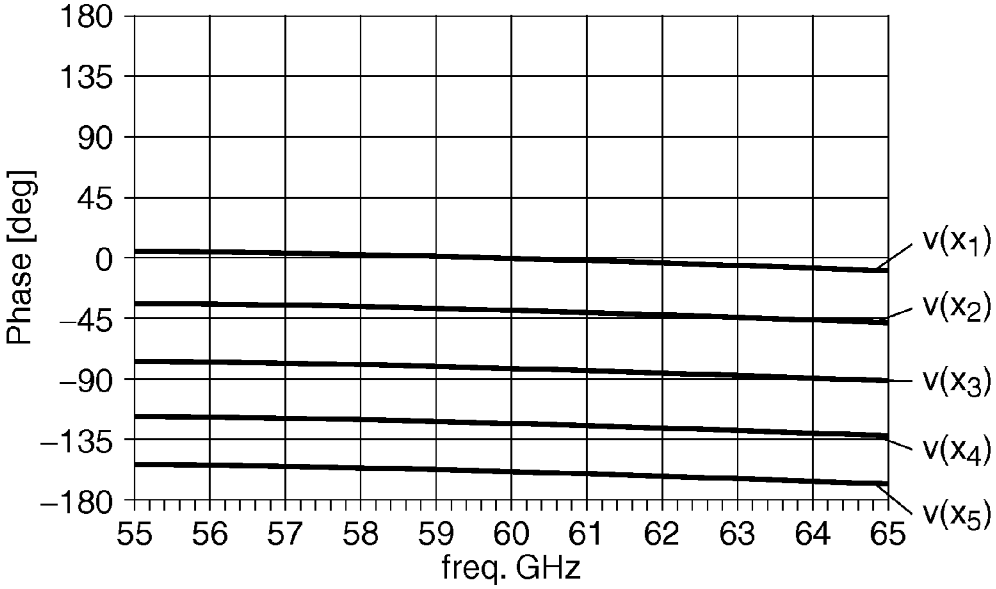

For a phase difference $\gamma=-160°$ between the HF signal sources, the measuring diagram of FIG. 7(*a*) reveals, that the amplitudes of the output signals $\nu(x_1)$, $\nu(x_2)$, $\nu(x_3)$, $\nu(x_4)$, $\nu(x_5)$ produced by the cascaded stages have an approximately constant value of approximately 3 dB, while in FIG. 7(*b*) the respective phase angles are approximately equally spaced starting with $\phi(\nu(x_1))\approx0°$ up to $\phi(\nu(x_5))\approx-160°$, such that the phase angle spacing $\Delta\phi$ between output signals produced by subsequent cascoded stages is approximately constant and in the magnitude of $\Delta\phi\approx-40°$.

Summarizing, the apparatus 100 for feeding antenna elements of a phased array antenna, comprises (FIG. 1) at least two transmission lines 101, 101' disposed in parallel and operated at a certain frequency as resonators, each of the transmission lines 101, 101' having a predetermined electrical length dimensioned to be at least approximately a quarter-wavelength of the operating frequency, a plurality of measuring positions provided on the transmission lines 101, 101' in spacings along the longitudinal direction x of the transmission lines, wherein each measuring position on one of the two transmission lines 101 faces directly a corresponding neighbored measuring position on the other transmission line 101' and such corresponding measuring positions being adjacent to each other in a direction transverse to the longitudinal direction of the transmission lines 101, 101' form a measuring position pair, respectively, wherein each of the circuits 110, 120, 130 detects and processes (amplifies or attenuates) the measuring signals from an assigned measuring position pair associated with the transmission lines 101, 101' for a corresponding longitudinal position as a function of a resonant field in the transmission lines at the respective positions, and further adds the measured and processed signals in order to generate output signals for feeding corresponding antenna elements.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single means or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An apparatus for feeding antenna elements of a phased array antenna, comprising:

at least two transmission lines disposed in parallel and operated at a certain frequency as resonators, each of the transmission lines having a predetermined length dimensioned to be at least approximately an electrical quarter-wavelength of the operating frequency, a plurality of measuring positions provided on the transmission lines in spacings along the longitudinal direction of the transmission lines, and a plurality of amplification/attenuating circuits adapted to detect measuring signals from measuring positions on the transmission lines as a function of a resonant field in the transmission lines at the respective positions, to process these measuring signals, and to generate output signals for feeding corresponding antenna elements, wherein each transmission line is coupled to a signal source, respectively, and the signal sources operate at the same frequency with a phase difference to each other, wherein one of the transmission lines with one end is coupled to the corresponding signal source, while the other transmission line with its opposite end is coupled to the other signal source, and wherein at least one pair of transmission lines is provided and signals from respective measuring positions of the transmission line pair are detected and amplified by corresponding amplification circuits, and summed so as to generate steering signals for antenna elements.

2. An apparatus according to claim 1, wherein the measuring positions are provided in equidistant spacings along the transmission lines.

3. An apparatus according to claim 1, wherein each measuring position on one of the two transmission lines faces directly a corresponding measuring position on the other transmission line and such corresponding measuring positions being adjacent to each other in a direction transverse to the longitudinal direction of the transmission lines form a measuring position pair, respectively, wherein each of the amplification/attenuating circuits detects and processes measuring signals from an assigned measuring position pair associated with the transmission lines for a corresponding longitudinal position.

4. An apparatus according to claim 1, wherein the amplification/attenuating circuits comprise amplifiers/attenuators, the gains/losses thereof being adjustable.

5. An apparatus according to claim 4, wherein the amplification/attenuating circuits comprise each a first and second amplifier for detection and amplification of measuring signals of an assigned measuring position pair, wherein the first amplifier of an amplification circuit detects and amplifies measuring signals of a measuring position of the first transmission line from a measuring position pair and the second amplifier detects and amplifies measuring signals of a corresponding measuring position of the second transmission line.

6. An apparatus according to claim 4, wherein the amplification circuits each comprise a summing element, that adds the said measuring signals detected and amplified by the amplifiers of the amplification circuits and produces an output signal assigned to a measuring position pair for feeding a corresponding antenna element.

7. An apparatus according to claim 4, wherein the gains/losses of the amplifiers of the amplification/attenuating circuits are controllable by a Digital-to-Analog Converter.

8. An apparatus according to claim 7, wherein the amplification circuits are configured as cascoded amplifiers.

9. An apparatus according to claim 1, wherein the amplification circuits are realized as field effect transistor circuits and the amplifiers are realized as common source stages, the inputs thereof are coupled to a corresponding measuring position pair and the outputs thereof are coupled to an input of the summing element configured as common gate stage.

10. An apparatus according to claim 1, wherein a second pair of at least two transmission lines is fed with a signal of a phase angle of approximately 0° and δ° with δ>0 and the output signals of the first and second transmission line pairs are summed so as to generate steering signals for antenna elements of a two dimensional planar array antenna.

11. A system comprising the apparatus according to claim 1 and a phased array antenna.

12. A receiver comprising the apparatus according to claim 1 and a phased array antenna, wherein the plurality of circuits is reversely operated such that inputs thereof are coupled to respective antenna elements and respective outputs thereof are coupled to a corresponding down conversion mixer.

13. A receiver according to claim 12, wherein the circuits comprise amplifiers designed for low noise.

* * * * *